United States Patent
Jochman (10) Patent No.: US 9,888,592 B2
(45) Date of Patent: Feb. 6, 2018

(54) RECTIFIER MODULE FOR POWER CONVERSION CIRCUITS

(71) Applicant: ILLINOIS TOOL WORKS INC., Glenview, IL (US)

(72) Inventor: Nathan J. Jochman, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/193,301

(22) Filed: Jun. 27, 2016

(65) Prior Publication Data

US 2016/0309601 A1    Oct. 20, 2016

Related U.S. Application Data

(63) Continuation of application No. 13/910,015, filed on Jun. 4, 2013, now Pat. No. 9,380,717.

(Continued)

(51) Int. Cl.
| | |
|---|---|
| *H01L 23/36* | (2006.01) |
| *H05K 5/00* | (2006.01) |
| *H05K 5/02* | (2006.01) |
| *H05K 7/14* | (2006.01) |
| *H05K 7/20* | (2006.01) |
| *H01L 23/367* | (2006.01) |

(Continued)

(52) U.S. Cl.
CPC ......... *H05K 5/0091* (2013.01); *H01L 23/367* (2013.01); *H02M 7/06* (2013.01); *H05K 5/0213* (2013.01); *H05K 5/0247* (2013.01); *H05K 5/04* (2013.01); *H05K 7/1432* (2013.01); *H05K 7/209* (2013.01); *H01L 23/3675* (2013.01); *H01L 2924/0002* (2013.01); *H02M 7/003* (2013.01)

(58) Field of Classification Search
CPC .......... H02M 7/003; H02M 7/06; H05K 5/00; H05K 5/04; H05K 5/02; H05K 7/20; H05K 5/0091; H05K 5/0247; H05K 7/209; H05K 7/1432; H05K 7/06; H01L 23/3675; H01L 2924/0002
See application file for complete search history.

(56) References Cited

U.S. PATENT DOCUMENTS

| | | | |
|---|---|---|---|
| 4,243,894 A | 1/1981 | Kuntner | |
| 5,468,976 A | 11/1995 | Evseev | |

(Continued)

FOREIGN PATENT DOCUMENTS

EP    1022085    7/2000

OTHER PUBLICATIONS

International Search Report from PCT application No. PCT/US2013/052360, dated Sep. 4, 2014, 8 pgs.

*Primary Examiner* — Matthew Nguyen
(74) *Attorney, Agent, or Firm* — McAndrews, Held & Malloy, Ltd.

(57) ABSTRACT

A rectifier module comprises a conductive housing made of injection molded aluminum or aluminum alloy. Diodes are inserted into recesses formed in the housing. The housing is placed at an alternating input potential during operation, and transmits alternating current input power to the diode modules for conversion to direct current power. Multiple recesses may be provided for high and low side diodes, of which there may be one or many. Multiple such modules may be provided for converting multiple phases of input power to direct current power.

20 Claims, 11 Drawing Sheets

Related U.S. Application Data

(60) Provisional application No. 61/676,585, filed on Jul. 27, 2012.

(51) Int. Cl.
*H02M 7/06* (2006.01)
*H05K 5/04* (2006.01)
*H02M 7/00* (2006.01)

(56) References Cited

U.S. PATENT DOCUMENTS

| | | | |
|---|---|---|---|
| 5,892,308 A | 4/1999 | Abadia | |
| 7,420,224 B2 | 9/2008 | Milich | |
| 7,505,273 B2 * | 3/2009 | Braun | H01L 23/36 |
| | | | 310/64 |
| 2005/0116559 A1 * | 6/2005 | Karam | H02K 11/046 |
| | | | 310/68 D |
| 2006/0232151 A1 * | 10/2006 | DuBois | H02K 11/046 |
| | | | 310/68 D |
| 2007/0046114 A1 * | 3/2007 | Kondo | H01L 25/115 |
| | | | 310/68 D |
| 2013/0285210 A1 | 10/2013 | Seok | |
| 2014/0286062 A1 | 9/2014 | Mao | |

* cited by examiner

RECTIFIER MODULE FOR POWER CONVERSION CIRCUITS

CROSS REFERENCE TO RELATED APPLICATIONS

This application is a Continuation of U.S. patent application Ser. No. 13/910,015, entitled "Rectifier Module for Power Conversion Circuits", filed Jun. 4, 2013, which is a Non-provisional Patent Application of U.S. Provisional Patent Application No. 61/676,585, entitled "Rectifier Module for Power Conversion Circuits", filed Jul. 27, 2012, both of which are hereby incorporated by reference in their entireties.

BACKGROUND

The present invention relates generally to the field of power conversion, and particularly to power conversion circuits used in power electronic equipment such as welding systems, plasma cutters, and so forth.

Many power electronic machines used in industry employ circuitry for converting power from one useful form to another. For example, welding and plasma cutting systems generally receive alternating current (AC) power from a source, such as the power grid or an engine generator. The power is typically converted to direct current (DC) power via rectifiers, then distributed on a DC bus to further power conversion circuitry. This further power conversion circuitry may include inverters, buck converters, boost converters, or various combination of these, which in general will convert the power to a different DC form or AC power for a load. In the case of welders and plasma cutters, the output power may be either DC or AC, depending upon the process utilized. Some systems are capable of outputting both AC and DC power for selected processes, adding to their utility and versatility.

In systems that employ rectifiers, a challenge exists in appropriate packaging of the rectifier components. In automotive applications, for example, alternators create AC power that is converted to DC power by diode modules that are integrated into the alternator itself. In industrial equipment, surface mounted or lead frame packages are commonly utilized. However, these arrangements are not always suitable for certain types of equipment. Moreover, these may require particular designs for either the power generation components, circuit packages, and so forth that may add additional cost and time required for assembly. Further, certain of these designs are not sufficiently robust for given applications, particularly for equipment that is mobile that is thus subjected to the environment or that may be subjected to vibration, such as engine generator applications.

BRIEF DESCRIPTION

The present invention provides a novel approach to AC waveform rectifier designs designed to respond to such needs. In accordance with certain embodiments, a rectifier module for power conversion circuits comprises a conductive housing having a plurality of recesses, the conductive housing configured to be placed at an alternating input potential in operation. At least one high side diode and at least one low side diode are disposed in the recesses and receive input power through the conductive housing and outputting rectified power in operation.

In accordance with other aspects, the invention provides a power conversion circuit that comprises a non-conductive support structure supporting power conversion circuitry. At least one rectifier module is provided that comprises a conductive housing having a plurality of recesses. The conductive housing is configured to be placed at an alternating input potential in operation. At least one high side diode and at least one low side diode are disposed in the recesses and receives input power through the conductive housing and outputting rectified power in operation.

The invention also provides a housing for a rectifier module is provided that comprises a conductive housing having a plurality of recesses for receiving diodes. The conductive housing is configured to be placed at an alternating input potential in operation and to transmit input power to the diodes via interior surfaces of the recesses.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
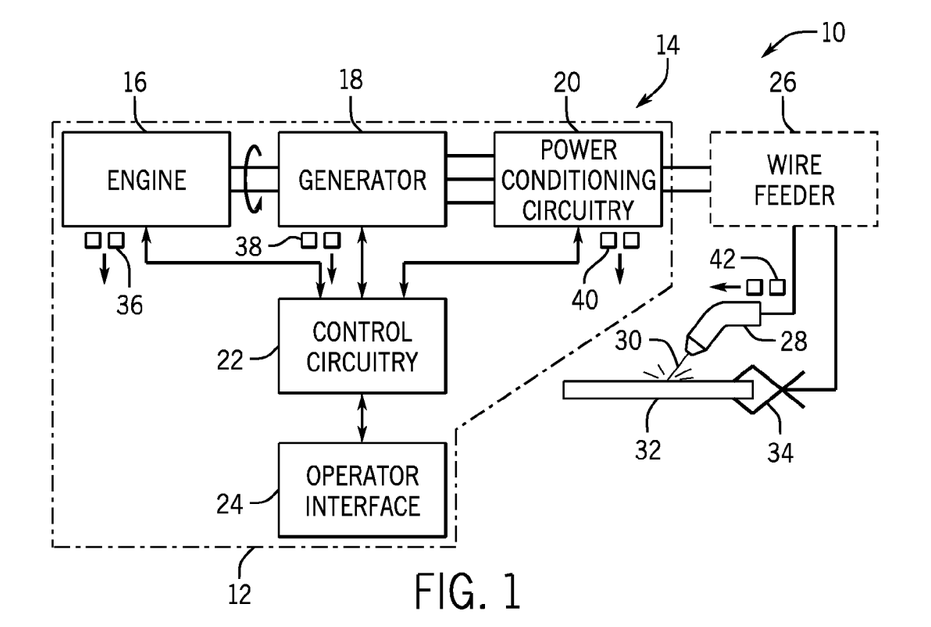
FIG. 1 is a diagrammatical representation of an exemplary application for power conversion circuitry, in the form of a welding system.

Turning now to the drawings, and referring first to FIG. 1, an exemplary welding system 10 is illustrated that includes a power supply 12 for providing power for welding, plasma cutting and similar applications. The power supply 12 in the illustrated embodiment comprises an engine generator set 14 that itself includes an internal combustion engine 16 and a generator 18. The engine 16 may be of any suitable type, such as gasoline engines or diesel engines, and will generally be of a size appropriate for the power output anticipated for the application. The engine will be particularly sized to drive the generator 18 to produce one or more forms of output power. In the contemplated application, the generator 18 is wound for producing multiple types of output power, such as welding power, as well as auxiliary power for lights, power tools, and so forth, and these may take the form of both AC and DC outputs. Various support components and systems of the engine and generator are not illustrated specifically in FIG. 1, but these will typically include batteries, battery chargers, fuel and exhaust systems, and so forth.

Power conditioning circuitry 20 is coupled to the generator 18 to receive power generated during operation and to convert the power to a form desired for a load or application. In the illustrated embodiment generator 18 produces three-phase power that is applied to the power conditioning circuitry 20. In certain embodiments, however, the generator may produce single phase power. The power conditioning circuitry includes components which receive the incoming power, converted to a DC form, and further filter and convert the power to the desired output form. More will be said about the power conditioning circuitry 20 in the discussion below.

The engine 16, the generator 18 and the power conditioning circuitry 20 are all coupled to control circuitry, illustrated generally by reference numeral 22. In practice, the control circuitry 22 may comprise one or more actual circuits, as well as firmware and software configured to monitor operation of the engine, the generator and the power conditioning circuitry, as well as certain loads in specific applications. Portions of the control circuitry may be centrally located as illustrated, or the circuitry may be divided to control the engine, generator and power conditioning circuitry separately. In most applications, however, such separated control circuits may communicate with one another in some form to coordinate control of these system components. The control circuitry 22 is coupled to an operator interface 24. In most applications, the operator interface will include a surface-mounted control panel that allows a system operator to control aspects of the operation and output, and to monitor or read parameters of the system operation. In a welding application, for example, the operator interface may allow the operator to select various welding processes, current and voltage levels, as well as specific regimes for welding operations. These are communicated to a control circuitry, which itself comprises one or more processors and support memory. Based upon the operator selections, then, the control circuitry will implement particular control regimes stored in the memory via the processors. Such memory may also store temporary parameters during operation, such as for facilitating feedback control.

Also illustrated in FIG. 1 for the welding application is an optional wire feeder 26. As will be appreciated by those skilled in the art, such wire feeders are typically used in gas metal arc welding (GMAW) processes, commonly referred to as metal inert gas (MIG) processes. In such processes a wire electrode is fed from the wire feeder, along with welding power and, where suitable, shielding gas, to a welding torch 28. In other applications, however, the wire feeder may not be required, such as for processes commonly referred to as tungsten inert gas (TIG) and stick welding. In all of these processes, however, at some point and electrode 30 is used to complete a circuit through a workpiece 32 and a work clamp 34. The electrode thus serves to establish and maintain an electric arc with the workpiece that aides in melting the workpiece and some processes the electrode, to complete the desired weld.

To allow for feedback control, the system is commonly equipped with a number of sensors which provide signals to the control circuitry during operation. Certain sensors are illustrated schematically in FIG. 1, including engine sensors 36, generator sensors 38, power conditioning circuitry sensors 40, and application sensors 42. As will be appreciated by those skilled in the art, in practice, a wide variety of such sensors may be employed. For example, engine sensors 36 will typically include speed sensors, temperature sensors, throttle sensors, and so forth. The generator sensors 38 will commonly include voltage and current sensors, as will the power conditioning circuitry sensors 40. The application sensors 42 will also typically include at least one of current and voltage sensing capabilities, to detect the application of power to the load.

Figure 2:
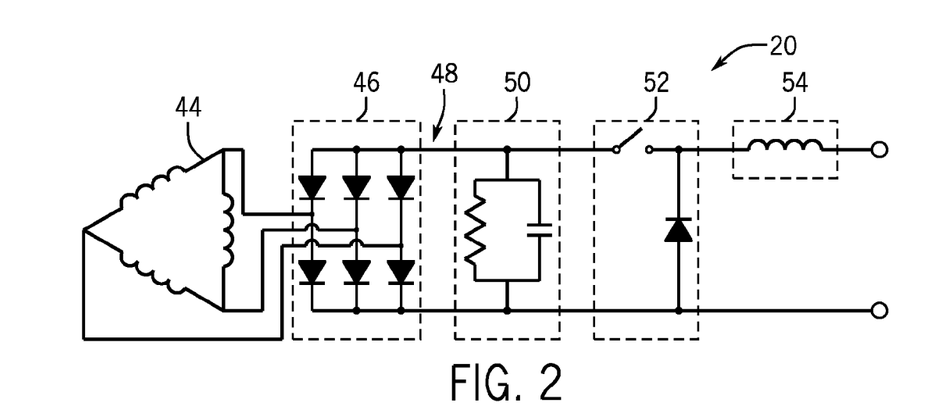
FIG. 2 is a circuit diagram for a portion of the power conversion circuitry of FIG. 1, particularly illustrating certain functional circuit components.

FIG. 2 illustrates electrical circuitry that may be included in the power conditioning circuitry 20 illustrated in FIG. 1. As shown in FIG. 2, this circuitry may include the generator windings 44, illustrated here as arranged in a delta configuration that output three-phase power to a rectifier 46. In the illustrated embodiment the three-phase rectifier is a passive rectifier comprising a series of diodes that provide a DC waveform to a DC bus 48. Power on the DC bus is then applied to filtering and conditioning circuitry 50 which aide in smoothing the waveform, avoiding excessive perturbations to the DC waveform, and so forth. The DC power is ultimately applied to a switch module 52, which in practice comprises a series of switches and associated electronic components, such as diodes. In welding applications, particular control regimes may allow for producing pulsed output, AC output, DC output, and particularly adapted regimes suitable for specific processes. As will be appreciated by those skilled in the art, various switch module designs may be employed, and these may use available components, such as insulated gate bipolar transistors (IGBTs), silicon controlled rectifiers (SCRs), transformers, and so forth. Many of these will be available in packaging that includes both the switches and/or diodes in appropriate configurations.

Finally, an output inductor 54 is typically used for welding applications. As will be appreciated by those skilled in the welding arts, the size and energy storage capacity of the output inductor is selected to suit the output power (voltage and current) of the anticipated application. Although not illustrated, it should also be noted that certain other circuitry may be provided in this arrangement, and power may be drawn and conditioned in other forms.

While only certain features of the exemplary systems have been illustrated and described herein, many modifications and changes will occur to those skilled in the art. For example, in addition to the output terminals illustrated in FIG. 2, power may be drawn from the DC bus for use in other conversion processes. This may allow for DC welding, for example, as well as for the supply of synthetic AC power for various auxiliary applications. The synthetic auxiliary power may be adapted, for example, for single phase power tools, lighting, and so forth. Where provided, such power may be output via separate terminals, or even conventional receptacles similar to those used for power grid distribution.

Figure 3:
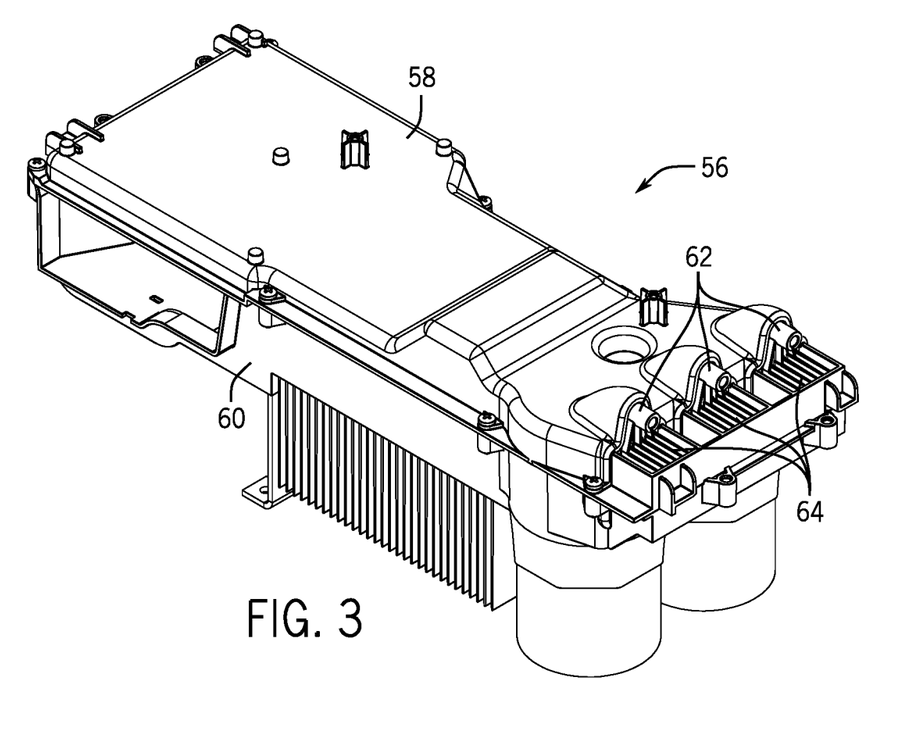
FIG. 3 is a perspective view of an exemplary power conversion module in accordance with aspects of the system shown in FIG. 1.

Various physical arrangements may be envisaged for packaging some or all of the circuitry discussed above. A presently contemplated arrangement is illustrated in FIG. 3. FIG. 3 shows an integrated power module 56 that incorporates essentially the rectifier circuitry of FIG. 2, the filtering and conditioning circuitry, as well as the switch modules. As discussed below, the integrated power module 56 also includes at least a drive board for the switches. Various bus structures are also included in the package as discussed below. The integrated power module 56 is illustrated as including an upper housing 58 and a lower housing 60. These may be made of non-conductive or insulative materials, such as injection molded plastic. The illustrated housings facilitate covering the components, supporting them mechanically, and also separating them as needed for electrical insulation purposes. Shown in FIG. 3 are input terminals 62 which lead into rectifier modules 64 discussed below. Each of these input terminals will be coupled to an output phase of the generator in a three-phase application.

Figure 4:
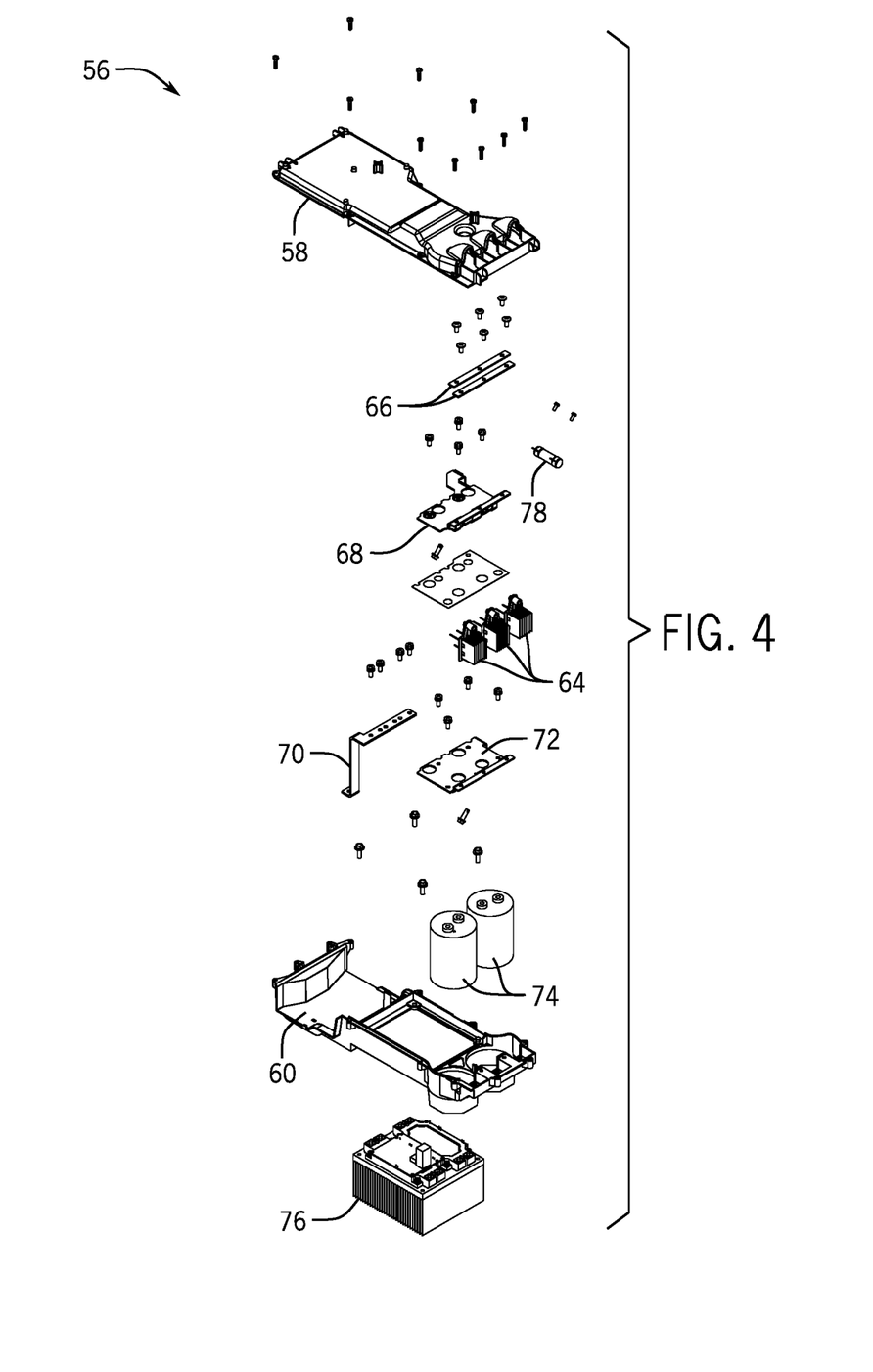
FIG. 4 is an exploded view of certain of the components of the module of FIG. 3.

FIG. 4 shows an exploded view of the exemplary module illustrated in FIG. 3. As mentioned above, the module 56 includes and upper housing 58 and a lower housing 60 with the various circuit components disposed in these housing sections and mechanically supported by the housing. In the illustration of FIG. 4, a pair of rectifier clamp bars 66 are shown that coupled to output of diodes within the rectifier modules as described more fully below. These clamp bars are conductive, and apply power to an upper bus plate 68. Bus plate 68 forms one side of the DC bus discussed above with reference to FIG. 2. A lower bus plate 72 is also illustrated and will make contact with diodes of the rectifier modules 64 to form the lower branch of the DC bus. An insulator plate is positioned between lower bus plate 72 and upper bus plate 68 for maintaining voltage potential between the plates. An output bus bar 70 is provided for channeling output power from the power module. Capacitors 74 are shown exploded from the lower housing 60. In the illustrated embodiment the lower housing 60 comprises apertures and structures designed to receive these capacitors, to mechanically support them, and to allow them to be coupled to the bus bar plates. The switch modules are comprised in a subassembly, in this case a buck converter module 76. The buck converter module is also secured to the lower housing, and supports a driver board for applying drive signals to the switches of the buck converter module. The buck converter module is in contact with the upper and lower bus plates when the integrated power module is assembled, as well as with the output bar 70. Finally, an output resistor 78 is provided that will extend between terminals external to the housing in the currently contemplated embodiment.

Figure 5:
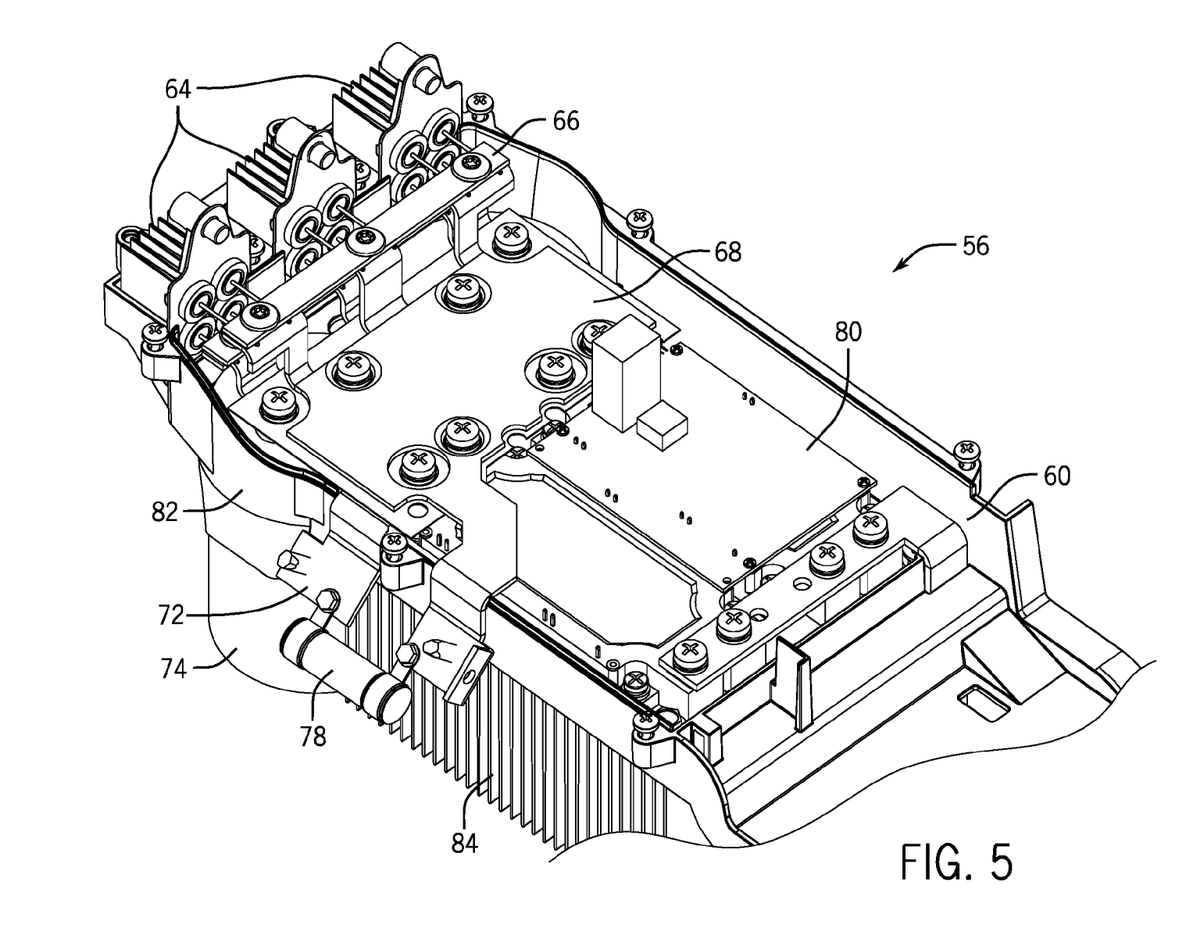
FIG. 5 is a partial perspective view of the same module with an upper enclosure element removed to reveal internal circuit components.

FIG. 5 is an illustration of the same module, from a different perspective and with the upper housing removed to show the interconnection of various components. Here the module 56 can be seen as comprising the lower housing with the rectifier modules 64 at an input end of the structure. The rectifier clamp bar 66 is in contact with upper diodes forming the rectifier. The upper bus plate 68 is also visible and is in contact with this same side of the rectifier modules and with the output terminal. The capacitors, one of which is visible in FIG. 5, are electrically and mechanically secured to both the upper bus plate 68 and to the lower bus plate 72, corners of which are visible in corner cut-outs of the upper bus plates. A driver circuit board 80 is shown in FIG. 5. As will be appreciated by those skilled in the art, the driver circuit board is populated with electronic circuitry that allows for application of drive signals to the power electronic switches of the buck converter module. These drive signals will typically be generated based upon control signals from the one or more processors within the control circuitry discussed above. As also shown in FIG. 5, conforming housing sections 82 may be defined for receiving and securely holding various components, such as the capacitors 74 in this case. Moreover, one or more of the circuits may be designed with fins to assist in air or forced cooling. Such fins 84 illustrated for the buck converter module shown in FIG. 4.

It has been found that the particular arrangements of the packaging shown in the figures is well suited to compact and efficient design, manufacturing, assembly and operation. In the illustrated embodiment, the circuit components may be formed in advance and sub-assemblies made, particularly of the converter module and the rectifier modules, as well as the drive circuit board. These are then simply assembled in the package as described. The resulting package is space and energy efficient, and allows for cooling of the power electronic devices during operation. The package may be used in wide range of applications and is particularly well-suited to the presently contemplated welding and plasma cutting applications, based upon inputs from a welder generator which is, together with the integrated power module, positioned in a mobile enclosure.

Figure 6:
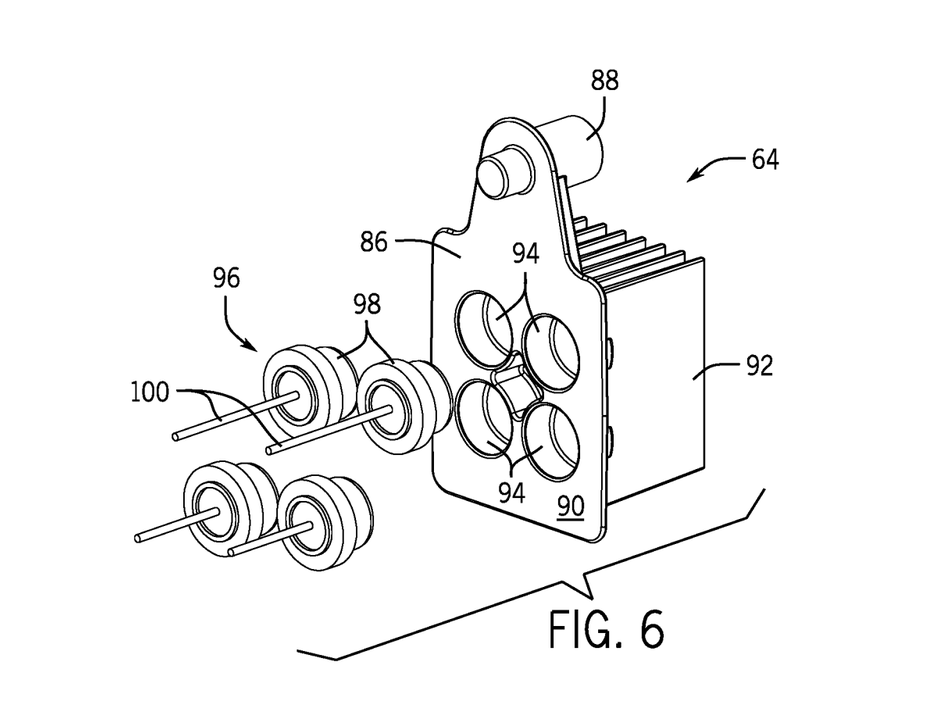
FIG. 6 is an exploded view of an exemplary rectifier module in accordance with aspects of the present disclosure.
Figure 7:
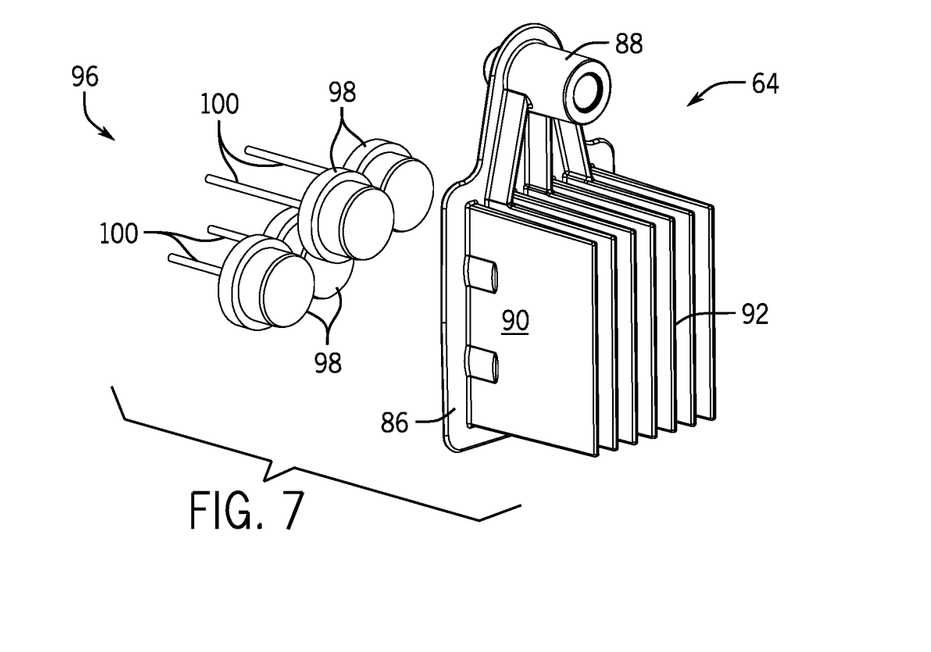
FIG. 7 is a perspective view of the same module from a back side.

FIGS. 6 and 7 illustrate a presently contemplated design for the rectifier modules that is useful in allowing them to be easily integrated into the power module. As shown in FIG. 6, for example, each rectifier module comprises a housing 86 which is made of an injection molded conductive material, such as aluminum or an aluminum alloy. The housing includes multiple integral features that are formed in the molding process. Ideally, little or no further machining is required following molding. The housing includes an integral terminal extension 88 to which an input conductor is coupled during assembly of the integrated power module into the welder generator. The body 90 of the housing 86 is unitary such that the entire body is placed at the potential applied to the terminal extension 88. Thus, when used in applications as a portion of a rectifier of AC input power, the rectifier module body will typically receive an AC waveform that is applied to the entire body during operation. The body comprises fin extensions 92 on rear side thereof to aid in cooling of the body and the entire module. Recesses 94 are formed in opposite face of the body and receive diode modules 96. In the illustrated embodiment for such diode modules are received, although it should be noted that the four diode modules function in the circuitry as only two diodes. That is, the upper two diode modules illustrated in the figures function as the upper diode in the rectifier circuitry of FIG. 2 (for one of the phases) while the lower pair of diodes function as the lower diode (for the same phase). Each diode module comprises a conductive body 98 within which the diode itself is formed. This conductive body forms the input side of each individual diode module, which is placed at the input potential when the diode modules are received within the recesses 94 of the body 90. Output conductors 100 of each module extend from a center of the prospective diode module. Electrical connection is made with these output conductors (which are sandwiched between the rectifier clamp bars discussed above). FIG. 7 illustrates the same diode module from a rear side. Here the fins 92 can be seen extending from the body 90, as well as the input terminal extension 88. The bodies 98 of the individual diode modules 96 are illustrated before they are pressed into the recesses 94 of the body.

It has been found that the foregoing design allows for a highly efficient manufacturing process, simple assembly, and robust performance. In particular, with each rectifier module body being placed at the input potential, multiple phases of the rectifier can be separated from one another by the non-conductive material of the housing (see, e.g., FIG. 5). It should also be noted that the flanged arrangements of the module body and the tongue-in-groove mounting allow for environmental isolation of the modules and diodes, which may be particularly important in mobile applications in which the circuitry may be subjected to weather and environmental factors, even when placed in a unit enclosure. In practice, one or multiple phases can be rectified in this manner. Moreover, it should be noted that while pairs of diodes are utilized to perform the function of individual diodes illustrated diagrammatically in FIG. 2, in practice, one, two or more such diodes may perform this function.

Thus, the body of the rectifier module may be re-configured and the recesses reduced or multiplied, and their position changed to accommodate the particular packaging envisaged.

The circuitry and systems described above may be controlled in various manners, depending upon the particular application or load. In the case of a welder driven by an engine generator set, it is presently contemplated that control may be made to the speed of the engine in order to optimize output of the generator and power conditioning circuitry. This optimization will typically allow for reduced speeds when appropriate for providing power to the welding load, with increased speeds where additional voltage and/or power are required. This allows for reduced fuel usage, noise and exhausts where lower power and/or voltage requirements are demanded, while nevertheless accommodating higher requirements within the capabilities of the system. FIGS. 8, 9 and 10 illustrate exemplary logic for carrying out this type of control.

Figure 8A:
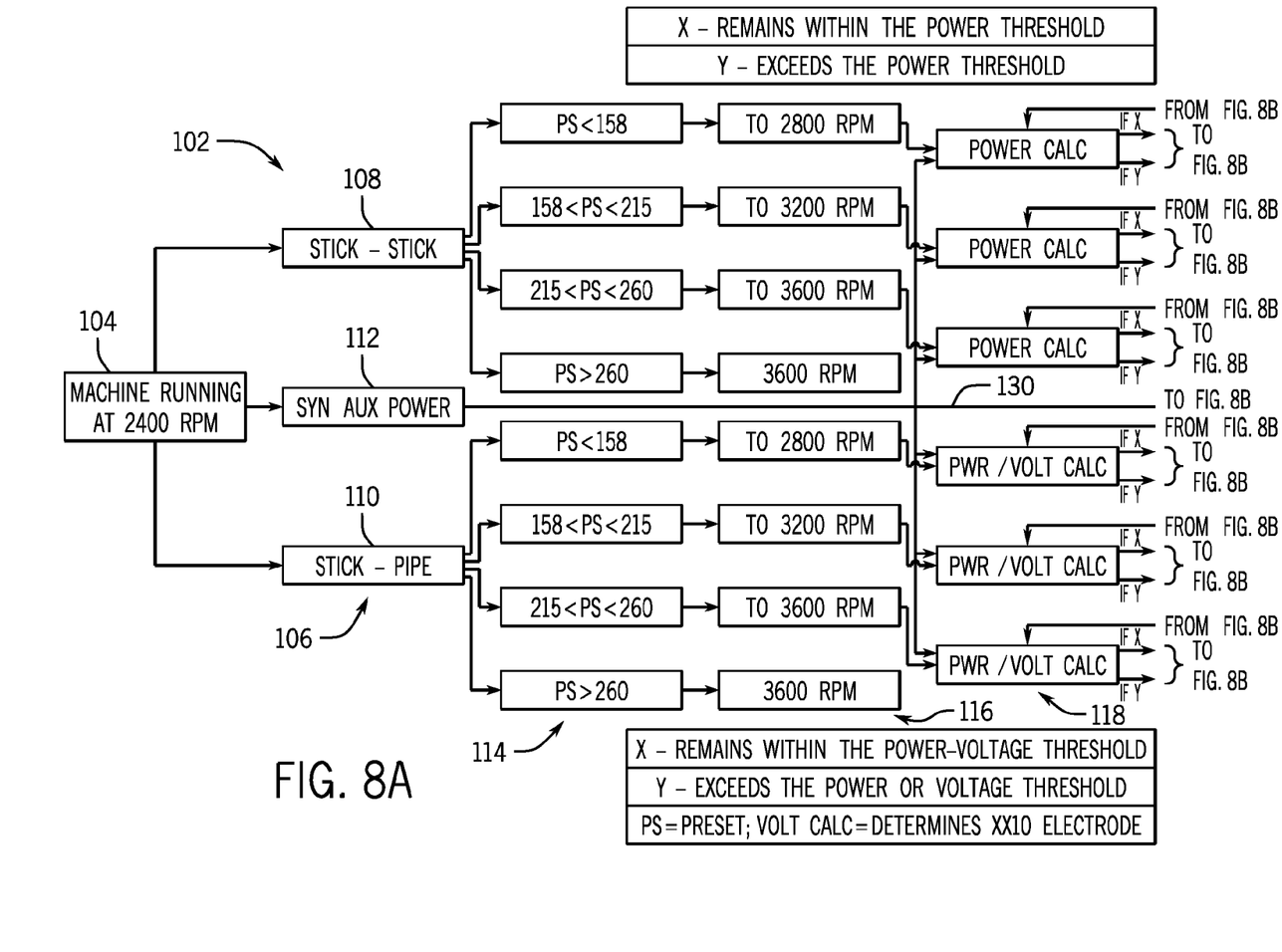
FIGS. 8A and 8B are flow charts illustrating exemplary logic for controlling the speed of an engine generator set in a welding application.

The control logic summarized in FIGS. 8A and 8A is particularly directed to decisions and control logics for stick welding applications. The exemplary logic, designated globally by reference numeral 102 begins at step 104 where an initial engine speed is adopted. In particular, engines presently contemplated will have a power and voltage curve that provide for higher output power and voltage as speed increases. The nominal initial speed of 2400 RPM can be regulated by feedback control of the engine speed and throttle positions (and any other desired controlled variables), typically implemented by an engine electronic governor or control circuitry of the type described above. As indicated by reference numeral 106, then, a process or mode will typically be selected by the operator. That is, the operator may, in a presently contemplated embodiment, enter a stick process, utilizing low hydrogen electrodes as indicated at reference numeral 108, or a cellulose electrode process as indicated at reference numeral 110. Moreover, synthetic auxiliary power may be generated by the system and output as indicated by reference numeral 112. The selection of the XX18 (low hydrogen) or XX10 (cellulose) mode will typically be made by the operator interface described above. The detection of synthetic auxiliary power output may be detected by a current sensor on an auxiliary power line of the power conditioning circuitry.

Based upon the mode, then, the system may detect a pre-set current for the welding output. As illustrated in FIG. 8A, this current may fall within various ranges, such as below 158 AMPS, above 260 AMPS, or at various ranges between. The current will typically be set via the operator interface. Based upon this current setting, then, the control circuitry causes the engine to accelerate to desired engine speed, again, adapted based upon the voltage and/or power curve of the engine. In the illustrated embodiment, the new speed indicated by reference numeral 116 will be either 2800 RPM, 3200 RPM, or 3600 RPM.

Thereafter, the algorithm will call for either a power calculation or a power and voltage calculation. Specifically, in a stick mode, in the illustrated embodiment, the system will sense current and voltage of the output waveform and calculate output power of the welding output based upon these measured parameters. Similarly, if synthetic power is output for auxiliary application, the auxiliary draw may be added to this welding power output to obtain the calculations indicated at reference numeral 118.

Figure 8B:
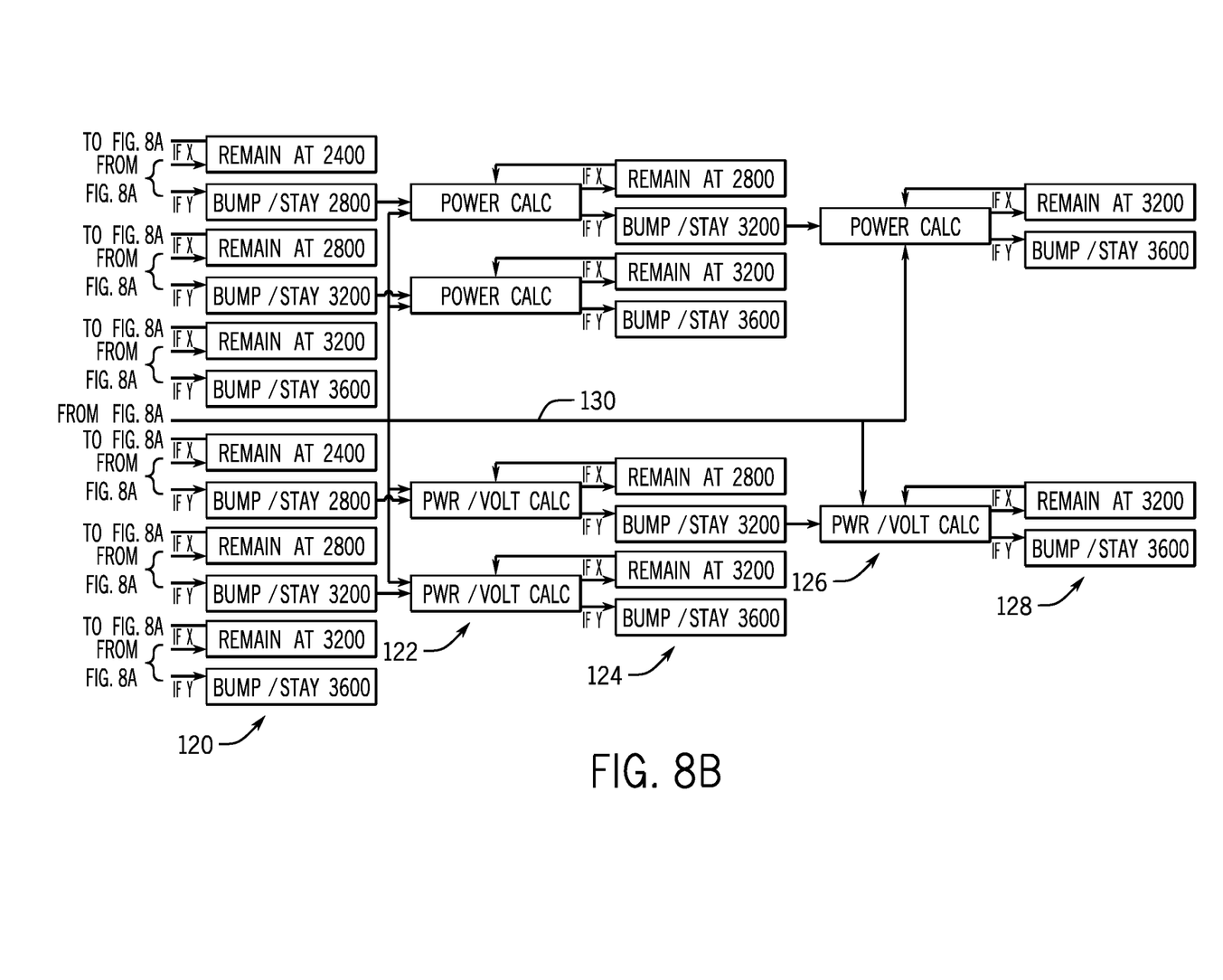

The logic summarized in FIGS. 8A and 8B also allow for determination of certain electrode types that may be used in stick welding, an adaptation of the engine and generator output performance based upon the electrode type. In particular, at step 118, if the system is operating in pipe mode, the logic may determine whether a certain type of electrode, in this case an electrode recognized in the art as "XX10" is identified by monitoring voltage spikes during initial welding operations. Such electrodes may be termed "cellulose" electrodes. To operate effectively such electrodes should be powered with sufficient voltage to ride through high voltage requirements unique to these electrode formulations. The voltage will not be constant, but a transient may be repeated and is detectable by monitoring the arc voltage. If the voltage requirement is not met, the arc may be unstable, and may intermittently be extinguished. While heretofore known power sources addressed such requirements by raising the voltage potential as high as possible and sometimes beyond during a weld, or using inductors or stabilizers in series with the output, the present approach uses an adaptive technique. This adaptive technique, like the other speed increase approaches summarized allows for running the engine as slow as possible to save on noise and fuel. The available voltage changes with engine speed and therefore the system will seek a speed just sufficient to stabilize the arc. In a presently contemplated embodiment, for example, when using XX10 electrodes, transients will be noted during the initial moments of welding. In this contemplated embodiment, if there are more than 5 (e.g., 10) such transients above a threshold (e.g., 44 volts) in the first second of welding, control moves the engine speed to the speed required as summarized in FIG. 8A.

Still more specifically, the control solution for this type of electrode allows for initiating and controlling the arc start, then monitoring for high voltage events once the arc is established. In one presently contemplated approach, if there are 10 such events, the engine speed is raised incrementally by increments of 400 RPM above the initial operating point. With cellulose electrodes, these events will be expected to happen quickly, and the engine speed change will generally be unnoticed. If the operator runs a different type of electrode but pulls the arc, the engine speed may also respond in a similar manner. This could be somewhat more noticeable, but would nevertheless provide smooth operation of the electrode. The control technique monitors the voltage of the output of the machine, which generally represents the arc voltage. In the presently contemplated embodiment, the voltage is monitored rapidly (e.g., every 100 uS). The system determines if the voltage events over the threshold represent the likely use of a cellulose electrode, and thus adapts for the electrode requirements. The higher engine speed will increase the bus voltage, and thereby the voltage output.

As indicated at reference numeral 120 in FIG. 8A and 8B, then, based upon the power calculation or power/voltage calculation at step 118, the system may remain at the current speed, or may increase in speed as required. Thereafter, similar calculations are made at step 122, and further boosts in engine speed and output are made, where appropriate, at step 124. At step 126 further similar calculations are made, to determine whether a final boost may be made to the final engine speed.

Several notes of interest should be made with reference to the logic summarized in 8A and 8B. First, once the arc is initiated for welding, the system may boost output to higher levels, but generally does not return to the initial speed until the arc is extinguished (i.e., after termination of a current weld). Moreover, once at a boosted speed, the system may remain at that speed or increase incrementally to higher speeds as required. Moreover, the increments in the presently contemplated design are of 400 RPM from the initial speed of 2400 RPM to a final speed of 3600 RPM. These increments could be of different magnitudes, of a different number, and could have different beginning and ending points, depending upon the engine specifications, the generator specifications, the number of steps desired, and so forth. In general, these steps will be contemplated based upon the overall engine power and voltage curves. Finally, while the power calculations as opposed to the power/voltage calculations are indicated for particular welding processes, similar calculations may be made independent of the particular selected process, particularly where certain types of electrodes with different anticipated performance may be employed.

Figure 9A:
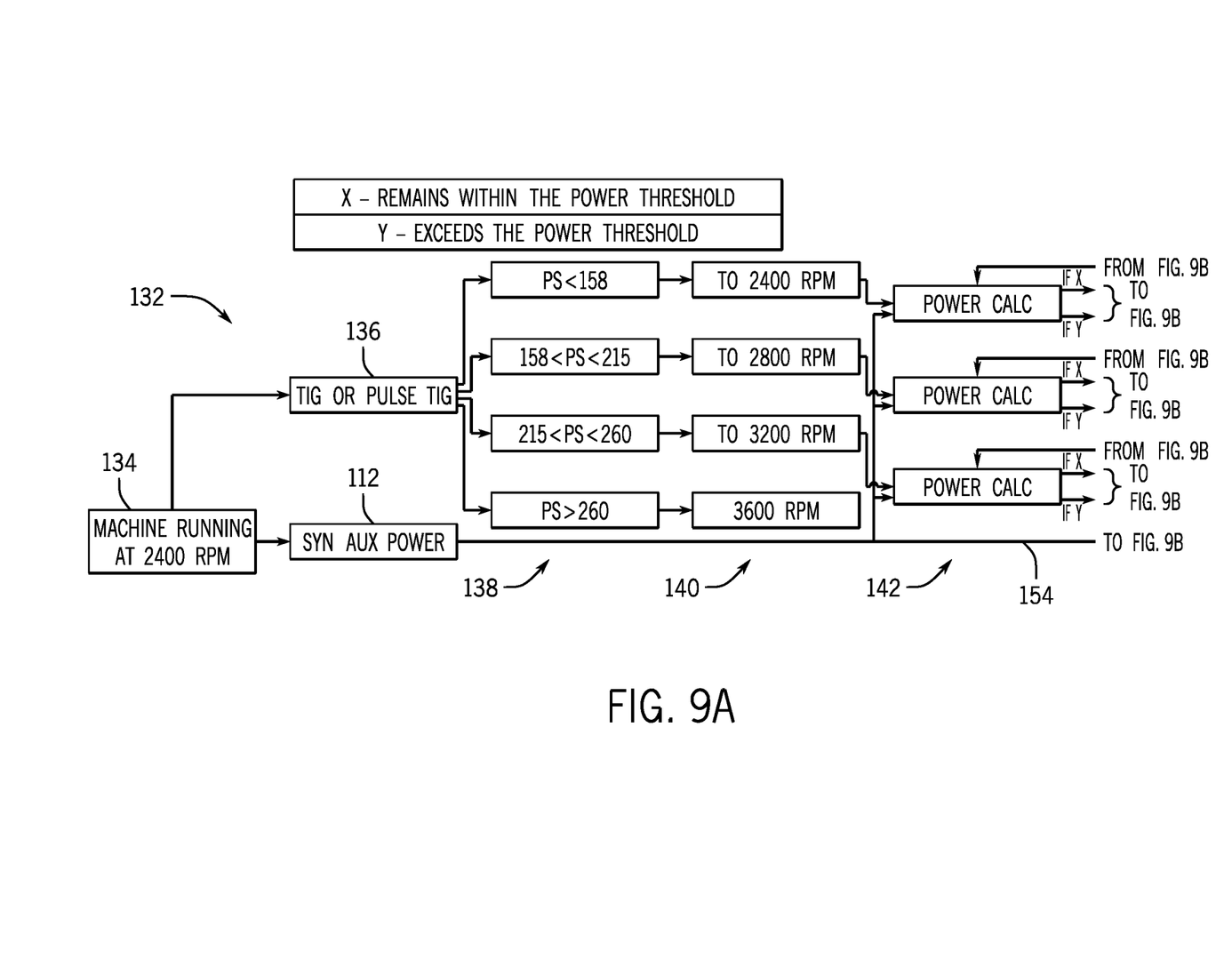
FIGS. 9A and 9B are similar flow charts illustrating logic for speed control of an engine generator.
Figure 9B:
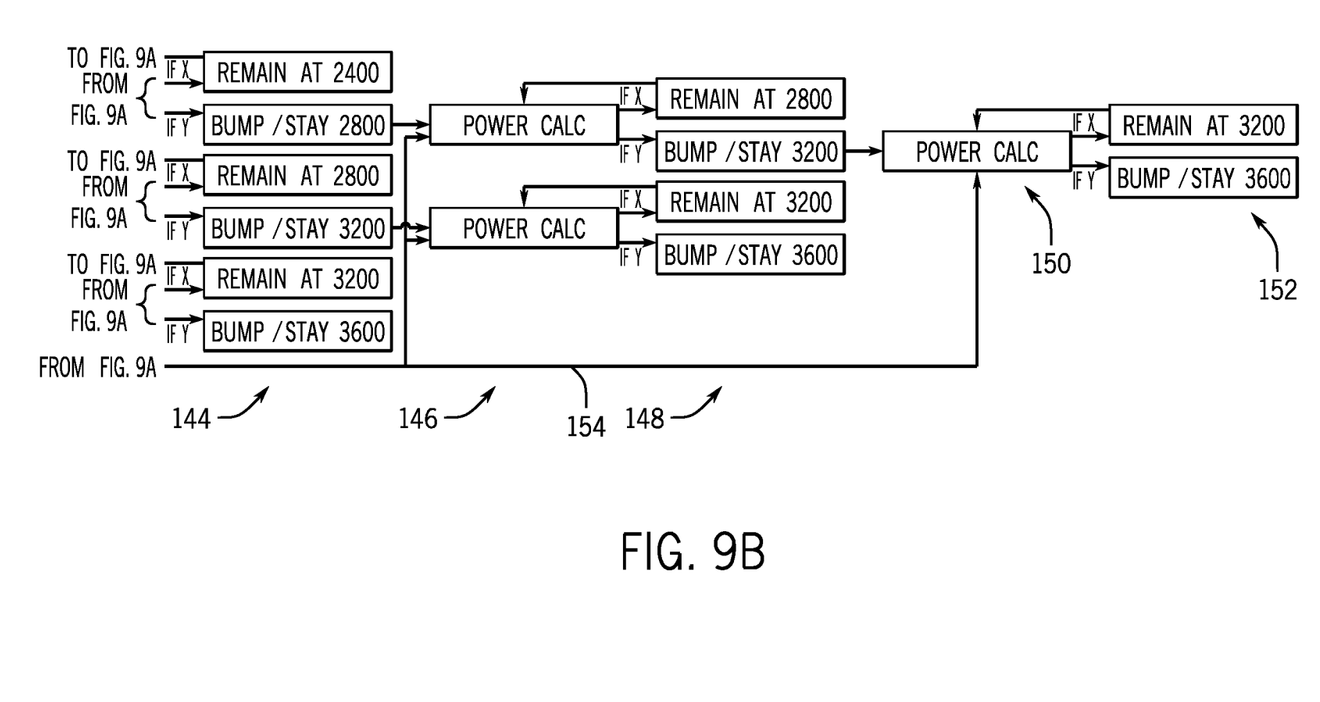

FIGS. 9A and 9B illustrate similar control logic, here for TIG welding applications. As indicated in FIG. 9A, this TIG control logic, designated generally be reference numeral 132 begins with an initial running condition of 2400 RPM as indicated at step 134. The user may select a TIG or pulse TIG process as indicated at step 136, such as via the power supply interface. Here again, synthetic auxiliary power output may be detected as indicated at step 112. At step 138, then, the system detects a preset current value within a desired range, as described above in the case of the stick welding logic. Based upon the selected process and the selected current, then, the engine may be caused to stay at the same speed or to increase speeds as indicated by reference numeral 140. As indicated by reference 142, then, a power calculation is made based upon detected current and voltage of the weld, and any auxiliary power draw may be added to this calculation ad indicated by reference numeral 154. As shown in FIG. 9B, then, at step 144 the system may determine to stay at the initial speed or current speed or to advance further to a higher speed. Similar power calculations are made, then, at step 146 and 150, resulting in decisions at steps 148 and 152. Here again, the beginning and end points for the speed range could be altered, as may the particular incremental increases based upon the power calculations. It may also be noted that, as in the case of stick welding, the logic summarized in FIGS. 9A and 9B generally do not allow for return to the initial engine speed until the arc is extinguished following the end of a particular weld.

Figure 10A:
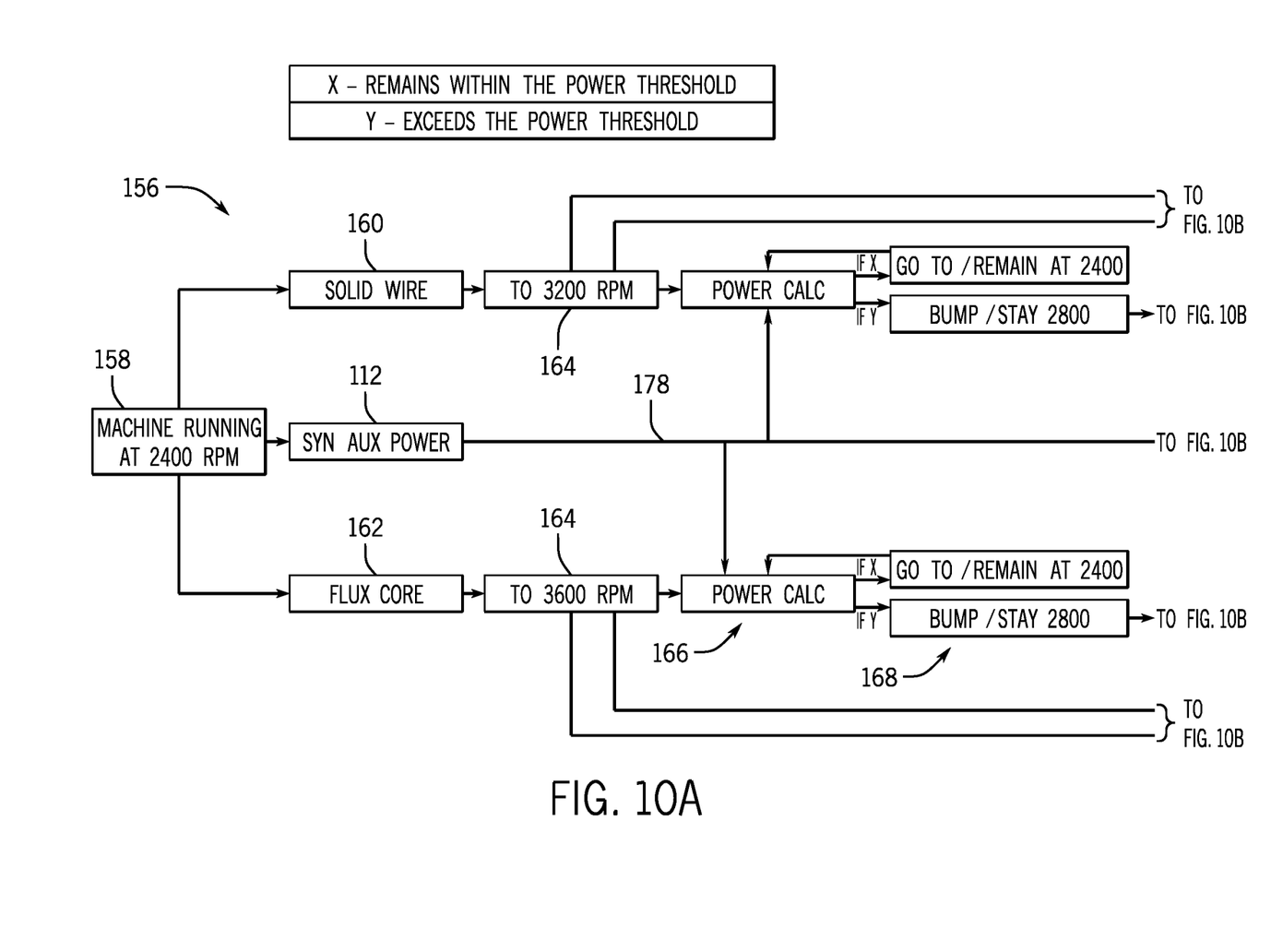
FIGS. 10A and 10B are similar flow charts illustrating logic for engine speed control for another exemplary application.
Figure 10B:
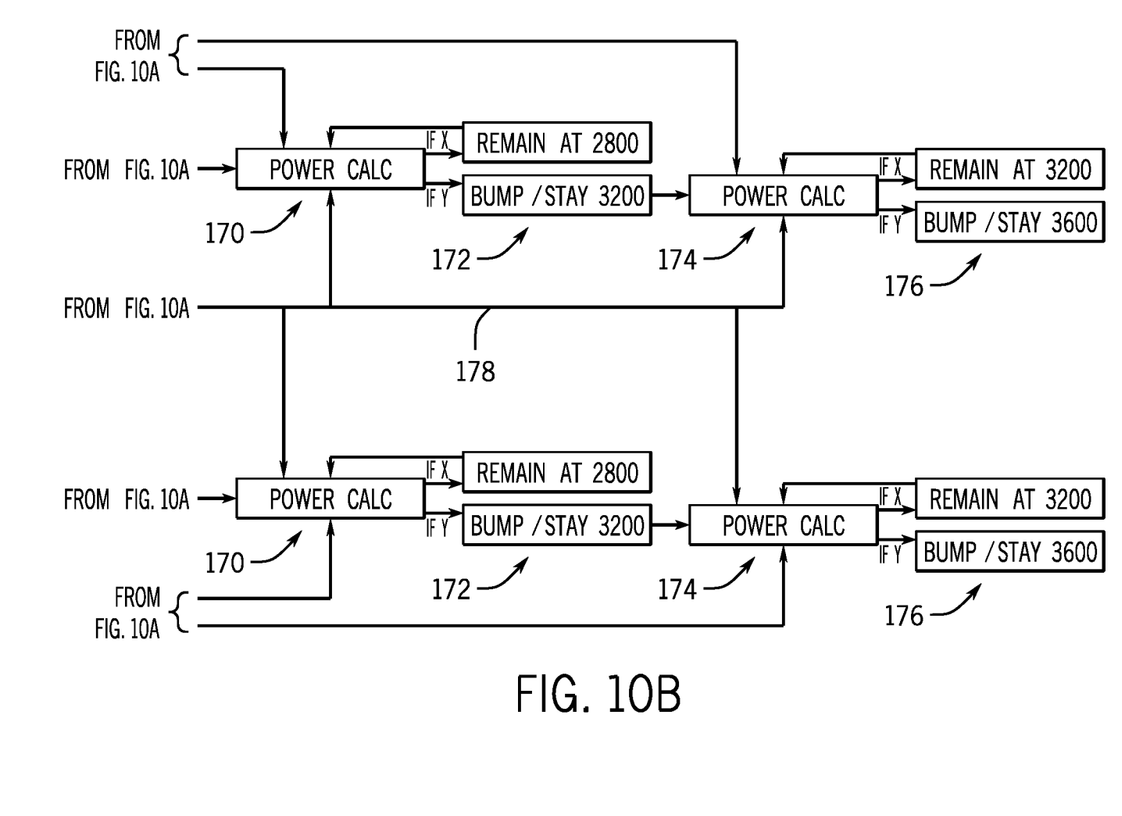

FIGS. 10A and 10B illustrate similar logic for MIG welding. This logic, designated generally by reference numeral 156, begins with an initial engine running speed at step 158. The operator may select between different MIG welding processes, such as a solid wire process as indicated by reference numeral 160 or a flux core process as indicated by reference numeral 162. Here again, synthetic auxiliary power may be provided as indicated at block 112. In the embodiment illustrated, the initial engine speed for use with solid wire is 3200 RPM, and for flux cored wire, 3600 RPM, as indicated at steps 164. For flux cored wire, this speed is held initially for 3 to 5 seconds before allowing a down-correction (as indicated at step 168). For solid wire, the initial speed is held approximately 1 second.

Subsequently, then, once the welding arc has started, a determination may be made whether to decrease the engine speed based upon a power calculation, as indicated by reference numeral 166, which may include addition of any auxiliary power draw as indicated at reference numeral 178. Based upon the calculation, the speed may be decreased and maintained or further altered. It should be noted that in this algorithm, the initial speed may be maintained if the load requires higher output, as indicated by the lines extending from step 164 to step 174 (see FIG. 10B). If a speed reduction is possible (based on reduced power requirements) the decrease may be implemented as indicated at step 168. Further calculations are then made at steps 170 and 174, which may be followed by decisions to increase speed as indicated at steps 172 and 176. Here again, once speed has increased during a particular weld, speeds are not generally decreased until that weld has terminated. Moreover, as in the logic for stick and TIG welding, the particular beginning and ending points of speed control, and the particular intervals or steps in speed may be adapted for different engines, generators and power conditioning circuitry.

The invention claimed is:

1. A rectifier module, comprising:
    a unitary housing comprising a conductive body having a plurality of recesses formed in a first side of the conductive body, wherein the conductive body of the unitary housing is configured to receive input power applied to the entire conductive body of the unitary housing; and
    at least one high side diode and at least one low side diode, the high and low side diodes configured to be disposed in the recesses of the conductive body of the unitary housing, wherein the high and low side diodes are configured to receive the input power through the conductive body of the unitary housing and to output rectified output power.

2. The rectifier module of claim 1, wherein the unitary housing is made of aluminum or an aluminum alloy.

3. The rectifier module of claim 1, wherein the unitary housing comprises integral heat dissipation fins.

4. The rectifier module of claim 3, wherein the integral heat dissipation fins extend from a second side of the conductive body of the unitary housing opposite the first side of the conductive body of the unitary housing in which the plurality of recesses are formed.

5. The rectifier module of claim 1, wherein the plurality of recesses comprises multiple high side recesses for multiple high side diodes and multiple low side recesses for low side diodes.

6. The rectifier module of claim 1, wherein the unitary housing comprises a flange extending around at least a part of the unitary housing for securing the rectifier module to a support structure.

7. The rectifier module of claim 1, wherein the high and low side diodes are configured to be press fit into the recesses to ensure electrical contact between an external conductive surface of the high and low side diodes and an interior conductive surface of the recesses.

8. A power conversion circuit, comprising:
    a non-conductive support structure supporting power conversion circuitry; and
    at least one rectifier module comprising a unitary housing comprising a conductive body having a plurality of recesses formed in a first side of the conductive body, wherein the conductive body of the unitary housing is configured to receive input power applied to the entire conductive body of the unitary housing, and at least one high side diode and at least one low side diode, the high and low side diodes configured to be disposed in the recesses of the conductive body of the unitary housing of the at least one rectifier module, wherein the high and low side diodes are configured to receive the input power through the conductive body of the unitary housing of the at least one rectifier module and to output rectified output power.

9. The power conversion circuit of claim 8, wherein the unitary housing of the at least one rectifier module comprises a flange extending around at least a portion of the unitary housing, and wherein the non-conductive support structure receives the flange to hold the rectifier module in place.

10. The power conversion circuit of claim 8, comprising three self-similar rectifier modules for converting three-phase input power to direct current power applied to a direct current bus.

11. The power conversion circuit of claim 8, wherein the unitary housing of the at least one rectifier module is made of aluminum or an aluminum alloy.

12. The power conversion circuit of claim 8, wherein the unitary housing of the at least one rectifier module comprises integral heat dissipation fins.

13. The power conversion circuit of claim 12, wherein the integral heat dissipation fins extend from a second side of the conductive body of the unitary housing of the at least one rectifier module opposite the first side of the conductive body of the unitary housing of the at least one rectifier module in which the plurality of recesses are formed.

14. The power conversion circuit of claim 8, wherein the plurality of recesses comprises multiple high side recesses for multiple high side diodes and multiple low side recesses for low side diodes.

15. A housing for a rectifier module, comprising:
a unitary conductive body having a plurality of recesses formed in a first side of the unitary conductive body and configured to receive at least two diodes, the unitary conductive body configured to receive input power applied to the entire unitary conductive body and to transmit the input power to the at least two diodes via interior surfaces of the recesses.

16. The housing of claim 15, wherein the unitary conductive body is made of aluminum or an aluminum alloy.

17. The housing of claim 15, wherein the unitary conductive body comprises integral heat dissipation fins.

18. The housing of claim 17, wherein the integral heat dissipation fins extend from a second side of the unitary conductive body opposite the first side of the unitary conductive body in which the plurality of recesses are formed.

19. The housing of claim 15, wherein the plurality of recesses comprises multiple high side recesses for multiple high side diodes and multiple low side recesses for low side diodes.

20. The housing of claim 15, wherein the unitary conductive body comprises a flange extending around at least a part of the unitary conductive body for securing the rectifier module to a support structure.

\* \* \* \* \*